United States Patent
Jang

(10) Patent No.: US 7,447,100 B2
(45) Date of Patent: Nov. 4, 2008

(54) OVER-DRIVING CIRCUIT FOR SEMICONDUCTOR MEMORY DEVICE

(75) Inventor: Chae-Kyu Jang, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/528,520

(22) Filed: Sep. 28, 2006

(65) Prior Publication Data

US 2007/0070757 A1 Mar. 29, 2007

(30) Foreign Application Priority Data

Sep. 29, 2005 (KR) ............... 10-2005-0091667
May 17, 2006 (KR) ............... 10-2006-0044164

(51) Int. Cl.
*G11C 5/14* (2006.01)

(52) U.S. Cl. ............ 365/226; 365/196; 365/191; 365/207

(58) Field of Classification Search .......... 365/226, 365/196, 191, 207
See application file for complete search history.

(56) References Cited

U.S. PATENT DOCUMENTS 6,122,212 A * 9/2000 Bui et al. ............... 365/207
6,314,028 B1 * 11/2001 Kono ............... 365/189.09
6,333,670 B1 * 12/2001 Kono et al. ............... 327/541
6,347,058 B1 2/2002 Houghton et al.
6,853,593 B1 2/2005 Bae
7,020,043 B1 3/2006 Lee
2005/0243624 A1 11/2005 Jang

FOREIGN PATENT DOCUMENTS

KR 10-2005-0009012 A 1/2005

OTHER PUBLICATIONS

Korean Patent Gazette issued in Korean Patent Application No. KR 10-0798765, dated Jan. 22, 2008.

* cited by examiner

*Primary Examiner*—Thong Q Le
(74) *Attorney, Agent, or Firm*—McDermott Will & Emery LLP

(57) ABSTRACT

An over-driving circuit for a semiconductor memory device is capable of rapidly securing a sensing operation of a bit line sense amplifier regardless of a level change of a power supply voltage. Timings are adjusted for supplying an over-driving voltage and for discharging based on a level change of a power supply voltage if a level thereof is changed when a bit line over-driving operation is in progress, thereby preventing an efficiency reduction of the over-driving operation.

21 Claims, 3 Drawing Sheets

OVER-DRIVING CIRCUIT FOR SEMICONDUCTOR MEMORY DEVICE

FIELD OF THE INVENTION

The present invention relates to a semiconductor memory device; and, more particularly, to an over-driving circuit capable of rapidly securing a sensing operation of a bit line sense amplifier regardless of a level change of a power supply voltage.

BACKGROUND

In order to reduce power consumption of a semiconductor memory device and secure its reliability, power supply voltage used therein is continuously decreasing. Hence, while the power consumption has been naturally reduced, the range of voltage and current that need to be sensed by circuits or elements constituting the memory device has decreased gradually. In other words, there has been a reduction in voltage and current margins. Therefore, a need has developed for circuits or elements capable of performing, with more precision, the sensing operation and also for sensing circuits that are capable of amplifying signals to a range appropriate to be senses by their receiving circuits or elements.

In general, a typical sensing circuit used in a semiconductor memory device is a Bit Line Sense Amp (BLSA) that serves to amplify data stored in memory cells upon reading and writing operations of the device.

Due to the increase in the degree of integration of the semiconductor memory device, higher performance of the BLSA has been required. BLSA, however, needs more time to amplify the signal to a desired voltage level as the load of elements to be pulled-up or pulled-down increases. Thus amplification often may not be obtained at the desired level. In order to compensate for this, the BLSA drives its pull-up line by using an over-driving mode that employs an external voltage VEXT (a power supply voltage VDD) and a core voltage VCORE together. The BLSA elevates a voltage level of a pull-up line RTO with the external voltage VEXT (the power supply voltage VDD) higher than the core voltage VCORE and thereafter applies the core voltage VCORE to the pull-up line RTO in order to improve the amplification speed of data therein.

FIG. 1 is a circuit diagram of a bit line sensing circuit having a conventional over-driving circuit.

With reference to FIG. 1, the conventional over-driving circuit includes a core voltage supplier 10 for driving a core voltage VCORE to a pull-up line RTO of a BLSA 40, a power voltage supplier 20 for providing an external voltage VEXT (a power supply voltage VDD) to the pull-up line RTO of the BLSA 40, a discharging unit 30 for discharging the voltage provided to the pull-up line RTO of the BLSA 40, and the BLSA 40.

The conventional over-driving circuit performs an over-driving operation by always applying the same over-driving timing and external voltage VEXT thereto, regardless of whether a level of the external voltage VEXT (the power supply voltage VDD) used for over-driving the BLSA is changed to a higher voltage level High_VDD or a lower voltage level Low_VDD than a predetermined voltage level. The power supply voltage is applied to drive DRAM and generally has a voltage level of 3.3 V in SDR DRAM, 2.5 V in DDR DRAM and LPSDR, 1.8 V in DDR2 DRAM, and 2.5 V in Rambus DRAM.

In this case, if the higher voltage level High_VDD is delivered to the pull-up line RTO of the sense amp due to a change of the external voltage VEXT (the power supply voltage VDD), generation of core voltage noise VCORE Noise and increased capacitance stress of memory cells can occur. Increased current consumption can result from an unnecessarily high voltage level.

Likewise, if the lower voltage level Low_VDD is delivered to the pull-up line RTO of the sense amp due to a change of the external voltage VEXT, a greater time is needed to amplify the data stored in cells of the BLSA to a desired voltage level because the voltage level for the over-driving is not sufficient, which yields an efficiency reduction of the over-driving operation.

SUMMARY OF THE INVENTION

It is, therefore, an object of the present invention to provide an over-driving circuit for a semiconductor memory device, which is capable of reducing current consumption caused by a change of a power supply voltage during an over-driving interval and also of preventing an efficiency reduction of an over-driving operation.

In accordance with the present invention, there is provided a semiconductor memory device, including a voltage change sensor for detecting voltage levels of a first signal and a second signal that are output when a voltage level of a power supply voltage is changed to be different from a predetermined voltage level, a high voltage controller for preventing a higher voltage from being supplied to a bit line sense amplifier in response to the second signal, and a voltage adjustor, in response to the first signal, for supplying a core voltage and the power supply voltage to the bit line sense amplifier respectively and discharging a voltage on the pull-up line of the bit line sense amplifier to thereby control a voltage level on the pull-up line of the bit line sense amplifier.

The present invention senses a level change of the power supply voltage in the bit line over-driving operation state and adjusts times for charging an over-driving voltage on the pull-up line of the bit line sense amplifier and for discharging the voltage charged thereon. Accordingly, the invention can reduce a current consumption caused by the power supply voltage with a higher voltage level and also prevent efficiency reduction by the same with a lower voltage level. To do so, the invention provides an over-driving circuit which senses a level change of the power supply voltage in the bit line over-driving operation state, and in response thereto, adjusts times for charging an over-driving voltage on the pull-up line of the bit line sense amplifier and for discharging the voltage charged thereon.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, preferred embodiments of the present invention will be described in detail with reference to the accompanying drawings. The present invention may, however, be embodied in many different forms, and should not be construed as limited to the embodiments set forth herein. Rather, these embodiments are provided so that this disclosure will be thorough and complete, and will fully convey the scope of the invention to those skilled in the art.

Figure 1:
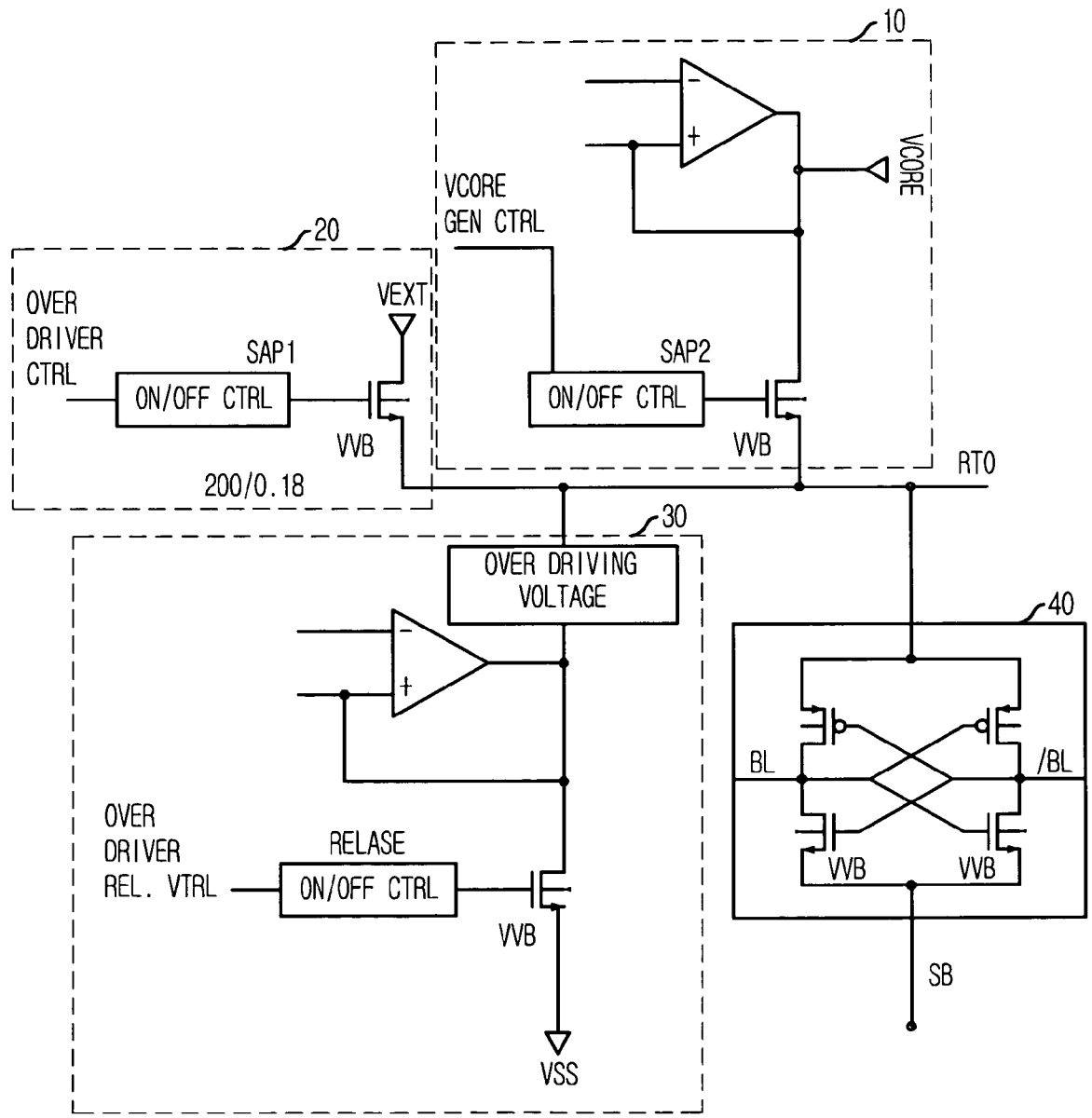
FIG. 1 is a circuit diagram of a bit line sensing circuit having a conventional over-driving circuit.
Figure 2:
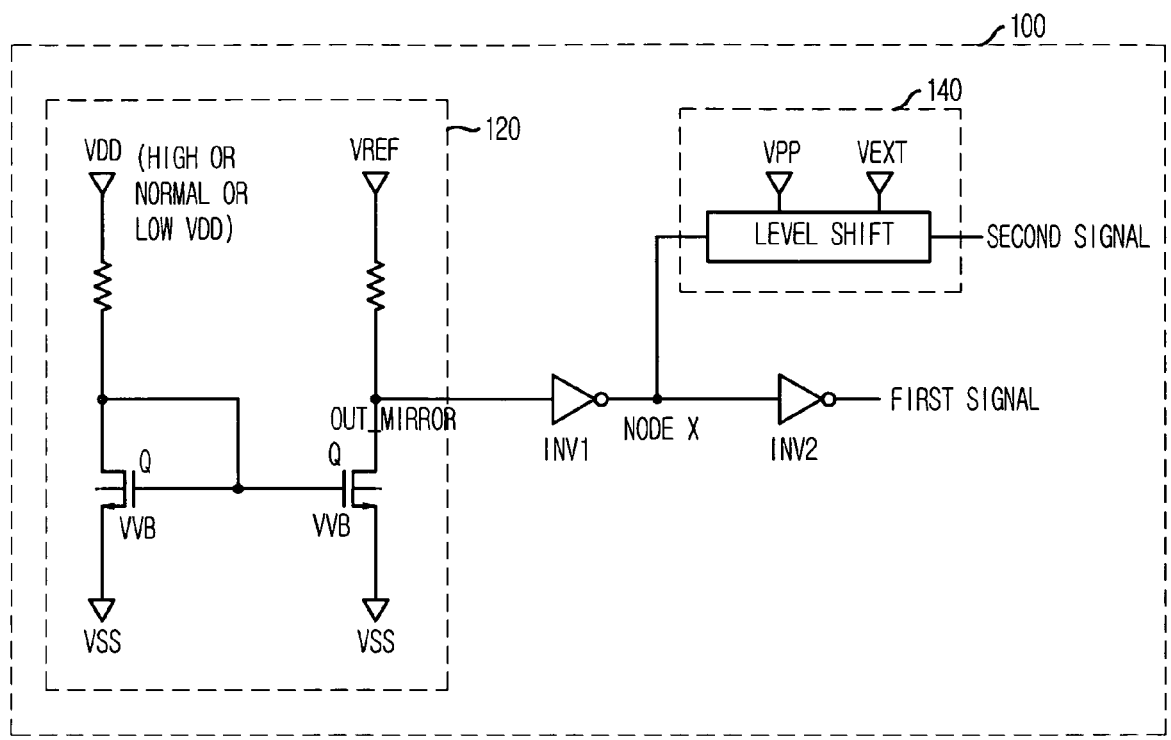
FIG. 2 is a circuit diagram of a device for sensing a change of a power supply voltage VDD in accordance with a preferred embodiment of the present invention.

FIG. 2 is a circuit diagram of a device for sensing a change of a power supply voltage VDD in accordance with a preferred embodiment of the present invention.

The sensing device 100 shown in FIG. 2 includes a current-mirror circuit 120, a first and a second inverters INV1 and INV2, and a level shifter 140.

The current-mirror circuit 120 receives a power supply voltage High VDD or Low VDD whose voltage level can be changed to be higher or lower than a predetermined voltage level Normal VDD by a change of PVT (Process, Voltage and Temperature) and a fixed voltage VREF that always has a constant voltage level regardless of the PVT change, wherein a level of an output voltage Out_Mirror is changed depending on a change (High VDD, Normal VDD, or Low VDD) of the power supply voltage VDD. The power supply voltage VDD is a power applied to drive DRAM, and generally has a voltage level of 3.3 V in SDR DRAM, 2.5 V in DDR DRAM and LPSDR, 1.8 V in DDR2 DRAM, and 2.5 V in Rambus DRAM.

The first inverter INV1 receives the output voltage Out_Mirror of the current-mirror circuit 120, and provides a voltage level, in which a phase is inverted, to a node X. The second inverter INV2 receives the signal provided at the node X and inverts its phase to provide it as a first signal.

The level shifter 140, if the voltage level of the power supply voltage VDD is changed in response to the logic level of the signal taken at the node X, outputs a changed voltage (a higher voltage VPP or a core voltage VCORE) as a second signal, and if no change happens, provides the power supply voltage VDD as the second signal.

With regard to a level of the voltage provided at the node X, a logic level provided in case of a level change (High VDD or Low VDD) of the power supply voltage VDD in the current-mirror circuit 120 has a phase opposite to that provided in the case of having no level change.

Further, if a voltage level of the power supply voltage VDD is changed to be lower (Low VDD) than the predetermined voltage level Normal VDD by the PVT change, the level shifter 140 provides the changed voltage (High VDD or Low VDD) output as the second signal as a higher voltage VPP. If a voltage level of the power supply voltage VDD is changed to be higher (High VDD) than the predetermined voltage level Normal VDD by the PVT change, the level shifter 140 provides the changed voltage (High VDD or Low VDD) output as the second signal as the core voltage VCORE.

In the preferred embodiment of the invention as mentioned above, the sensing device 100 senses a change of the power supply voltage VDD when it is changed to the lower level (Low VDD) or no change happens (Normal VDD). Conversely, design modifications may be made to sense a level change of the power supply voltage VDD when it is changed to the higher level (High VDD) by a designer.

Figure 3:
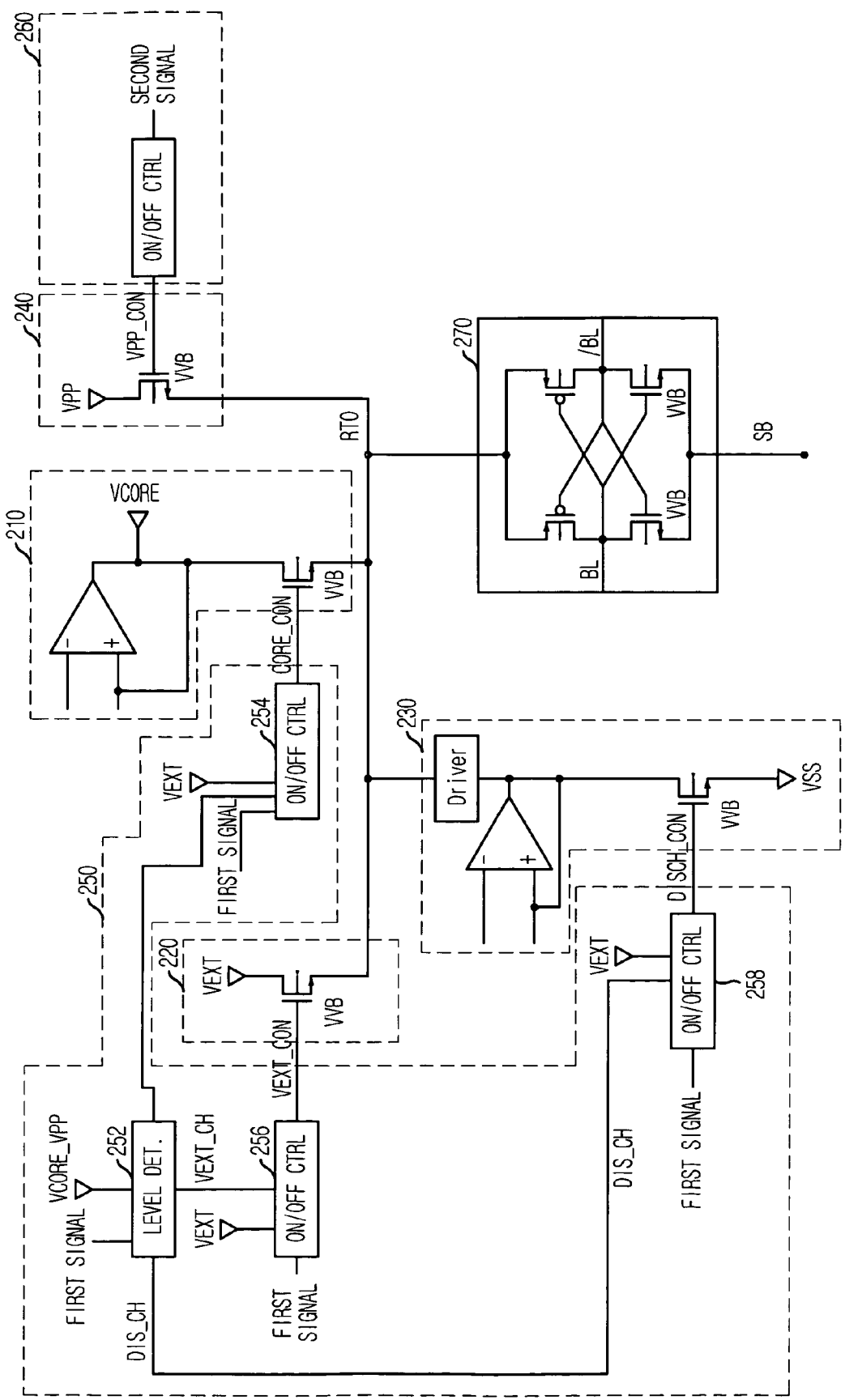
FIG. 3 is a circuit diagram of a bit line sensing circuit having an over-driving circuit in accordance with a preferred embodiment of the invention.

FIG. 3 is a circuit diagram of a bit line sensing circuit having an over-driving circuit in accordance with a preferred embodiment of the invention.

Referring to FIG. 3, the bit line sensing circuit 200 of the invention includes a core voltage supplier 210, a power voltage supplier 220, a discharging unit 230, a higher voltage supplier 240, a voltage adjustor 250, a higher voltage controller 260, and a BLSA 270.

The core voltage supplier 210 supplies a voltage level of a core voltage VCORE to a pull-up line RTO of the BLSA 270. The power voltage supplier 220 supplies an external voltage VEXT (a power supply voltage VDD) to the pull-up line RTO of the BLSA 270. The discharging unit 230 discharges the voltage on the pull-up line RTO of the BLSA 270. The high voltage supplier 240 supplies a higher voltage VPP to the pull-up line RTO of the BLSA 270.

The voltage adjustor 250, in response to the first signal that is provided when a voltage level of the power supply voltage VDD sensed by the sensing device 100 shown in FIG. 2 is changed (High VDD or Low VDD) or no change is occurred (Normal VDD), adjusts times for driving each of the core voltage VCORE and the power supply voltage VDD to the pull-up line RTO of the BLSA 270 and for discharging a voltage on the pull-up line RTO of the BLSA 270, to thereby adjust a level of the voltage fed to the pull-up line RTO of the BLSA 270.

The high voltage controller 260 controls an operation for supplying a higher voltage VPP to the pull-up line RTO of the BLSA 270 in response to the second signal that is output when the power supply voltage VDD sensed by the sensing device 100 shown in FIG. 2 is changed (High VDD or Low VDD) or no change happens (Normal VDD).

Among the components included in the bit line sensing circuit 200 of the invention, the voltage adjustor 250 is provided with a level detector (level det.) 252, a core voltage adjustor (on/off ctrl) 254, a power supply voltage adjustor (on/off ctrl) 256, and a discharging voltage adjustor (on/off ctrl) 258.

The level detector 252 detects voltage levels of a first and a second charging voltages CORE_CH and VEXT_CH and a discharge voltage DIS_CH that are output in response to the first signal provided by the sensing device 100 shown in FIG. 2. The core voltage adjustor 254 outputs a core adjustment signal CORE_CON to control the core voltage supplier 210 in response to the first signal provided by the sensing device 100 shown in FIG. 2 and the first charging voltage CORE_CH to thereby adjust time for supplying the core voltage VCORE to the pull-up line RTO of the BLSA 270.

The power supply adjustor 256 outputs a power adjustment signal VEXT_CON to control the power voltage supplier 220 in response to the first signal provided by the sensing device 100 shown in FIG. 2 and the second charging voltage VEXT_CH to thereby adjust time for supplying the power supply voltage VDD to the pull-up line RTO of the BLSA 270. The discharge voltage adjustor 258 outputs a discharge adjustment signal DISHCH_CON to control the discharging unit 230 in response to the first signal provided by the sensing device 100 shown in FIG. 2 and the discharge voltage DIS_CH to thereby adjust time for discharging the voltage on the pull-up line RTO of the BLSA.

More specifically, among the components of the voltage adjustor 250, the core voltage adjustor 254 adjusts a logic level of the core adjustment signal CORE_CON output in response to the first signal provided by the sensing device 100 shown in FIG. 2 to thereby control on/off operations for supplying the core voltage VCORE to the pull-up line RTO of the BLSA 270. Further, it adjusts time when the core adjustment signal CORE_CON is activated to logic high in response to a voltage level of the first charging voltage CORE_CH output from the level detector 252 to thereby control a time duration of the core voltage VCORE fed to the BLSA 270.

The power supply voltage adjustor 256 adjusts a logic level of the power adjustment signal VEXT_CON output in response to the first signal provided by the sensing device 100 shown in FIG. 2 to thereby control on/off operations for supplying the power supply voltage VDD to the pull-up line RTO of the BLSA 270. In addition, it further adjusts time when the power adjustment signal VEXT_CON is activated to logic high in response to a voltage level of the second charging voltage VEXT_CH obtained by the level detector 252 to thereby control a time duration of the power supply voltage VDD fed to the BLSA 270.

The discharge voltage adjustor 258 adjusts a logic level of the discharge adjustment signal DISCH_CON issued in response to the first signal provided by the sensing device 100 shown in FIG. 2 to thereby control on/off operations for discharging the voltage on the pull-up line RTO of the BLSA 270. Further, it adjusts time when the discharge adjustment signal DISCH_CON is activated to logic high in response to a voltage level of the discharge voltage DIS_CH obtained by the level detector 252 to thereby control time for discharging the voltage fed to the BLSA 270.

Among the components of the bit line sensing circuit 200, the core voltage supplier 210 includes an NMOS transistor for adjusting the core voltage VCORE received via its drain to be fed to the pull-up line RTO of the BLSA 270 in response to the core adjustment signal CORE_CON input via its gate.

Further, the power voltage supplier 220 includes an NMOS transistor for adjusting the power supply voltage VDD received via its drain to be fed to the pull-up line RTO of the BLSA 270 in response to the power adjustment signal VEXT_CON input via its gate.

The discharging unit 230 includes an NMOS transistor for adjusting the voltage fed to the pull-up line RTO of the BLSA 270 received via its drain to be discharged to a ground voltage VSS in response to the discharge adjustment signal DISCH_CON input via its gate.

The high voltage controller 260 provides a higher voltage control signal VPP_CON in response to the second signal that is provided when the power supply voltage sensed by the sensing device 100 shown in FIG. 2 is changed (High VDD or Low VDD) or no change happens (Normal VDD) to thereby control an operation for supplying the higher voltage VPP to the pull-up line RTO of the BLSA 270. To be more specific, the high voltage controller 260 adjusts a logic level of the higher voltage control signal VPP_CON in response to a voltage level of the second signal provided by the sensing device 100 shown in FIG. 2 to control on/off operations for supplying the higher voltage VPP to the pull-up line RTO of the BLSA 270.

The following is a detailed operation description of the bit line sensing circuit 200 including the over-driving circuit of the present invention with reference to FIG. 3.

When a change of the power supply voltage VDD is sensed by the sensing circuit shown in FIG. 2, the second signal output from the level shifter 140 and first signal from the second inverter INV2 are applied to the level detector 252, the core voltage adjustor 254, the power supply voltage adjustor 256, the discharge voltage adjustor 258, and the high voltage adjustor 260 shown in FIG. 3, wherein a voltage level being fed to the pull-up line RTO of the BLSA 270 is decided.

The level detector 252 accepts the first signal output from the second inverter INV2 shown in FIG. 2 and adjusts voltage levels of the first charging voltage CORE—CH to be provided to the core voltage adjustor 254, the second charging voltage VEXT—CH to be provided to the power supply voltage adjustor 256, and the discharge voltage DIS—CH to be provided to the discharge voltage adjustor 258.

If the power supply voltage VDD is changed to be lower (Low VDD) than the predetermined voltage level in the sensing device 100 shown in FIG. 2, the core voltage adjustor 254 and the discharge voltage adjustor 258 are controlled to be turned on in response to the first signal, thereby activating the core adjustment signal CORE—CON and the discharge adjustment signal DISCH—CON to logic high respectively. Accordingly, the core voltage VCORE is provided to the pull-up line RTO of the BLSA 270 or the voltage fed to the pull-up line RTO of the BLSA 270 is discharged. A timing, on which an operation of driving the pull-up line of the BLSA 270 or a discharge operation by turning on the core voltage adjustor 254 and the discharge voltage adjustor 258 occur, is decided based on the first charging voltage and the discharge voltage output from the level detector 252, wherein the timing means an operation sequence and a time duration. That is, in this embodiment where the power supply voltage VDD is changed to a lower level, the core voltage VCORE is fed to the pull-up line RTO of the BLSA 270 and thus the time duration is lengthened more than that of a case of having no change, thereby compensating the power supply voltage VDD changed to the lower level.

Further, the power supply voltage adjustor 256 is controlled to be turned off in response to the first signal to thereby inactivate the power adjustment signal VEXT_CON to logic low. Accordingly, the power supply voltage VDD is not provided to the pull-up line RTO of the BLSA 270. That is, this has no influence upon the level change of the voltage provided to the pull-up line RTO of the BLSA 270. In this case, the second charging signal VEXT_CH also has no meaning.

As described above, the second signal output from the level shifter 140 shown in FIG. 2 becomes the higher voltage VPP and then applied to the high voltage controller 260 shown in FIG. 3, instead of turning off the power supply voltage adjustor 256 such that the power supply voltage VDD is not provided. This causes the higher voltage control signal VPP_CON output from the high voltage controller 260 to be activated to logic high, thereby feeding the higher voltage VPP to the pull-up line RTO of the BLSA 270. In other words, the voltage level of the power supply voltage VDD to perform the over-driving operation has the lower value Low_VDD than the predetermined voltage level. Therefore, in order to compensate the difference therebetween, the higher voltage VPP having a higher voltage level than the power supply voltage VDD is fed to the pull-up line RTO of the BLSA 270, thereby fully amplifying data by a required voltage level at the time of the over-driving operation.

On the contrary, if the power supply voltage VDD is changed to be higher (High VDD) than the predetermined voltage, the core voltage adjustor 254, the power supply adjustor 256 and the discharge voltage adjustor 258 are controlled to be turned on in response to the first signal, which activate the core adjustment signal CORE_CON the power adjustment signal VEXT_CON and the discharge adjustment signal DISCH_CON to logic high, respectively. Accordingly, the core voltage VCORE and the power supply voltage VDD are fed to the pull-up line RTO of the BLSA 270 or the voltage fed to the pull-up line RTO of the bit line sense amplifier 270 is discharged. A timing, on which an operation of driving the pull-up line of the BLSA 270 or a discharge operation by turning on the core voltage adjustor 254, the power supply voltage adjustor 256 and the discharge voltage adjustor 258 rise, is decided based on the first and the second charging voltages CORE_CH and VEXT_CH and the discharge voltage DIS-CH output from the level detector 252, wherein the timing means an operation sequence and a time duration. That is, in this embodiment where the power supply voltage VDD is changed to a higher level High VDD, a time duration, which keeps the power supply voltage to be fed to the pull-up line RTO of the BLSA 270, is more shortened than that of a case of having no change. A start time for discharging the voltage fed to the pull-up line RTO of the BLSA 270 is faster and the time duration is more lengthened than those of a case of having no change respectively, thereby compensating the power supply voltage VDD changed to the higher level. (Q1)

Further, the high voltage adjustor 260 is controlled to be turned off in response to the second signal (which is the power supply voltage VDD) output from the level shifter 140 shown in FIG. 2, which inactivates the higher voltage adjustment signal VPP_CON to logic low. Accordingly, the higher voltage VPP is not fed to the pull-up line RTO of the BLSA 270. That is, since the voltage level of the power supply voltage VDD to perform the over-driving operation has a higher value (High_VDD) than the predetermined voltage level, timings for feeding the power supply voltage VDD to the pull-up line RTO of the BLSA 270 and for discharging the voltage fed thereto are adjusted to compensate the difference therebetween, thereby suppressing issuance of unnecessary current at the time of the over-driving operation.

Using the preferred embodiment of the invention as mentioned above, it is possible to adjust the timings (such as operation sequence, start time and time duration) for supplying the over-driving voltage to the pull-up line of the BLSA 270 and for discharging the voltage supplied thereto based on the level change of the power supply voltage VDD, even when the level of the power supply voltage VDD is changed when the bit line over-driving operation is in progress. Thus, the level of the voltage being supplied to the pull-up line RTO of the BLSA 270 can be adjusted. That is, although the power supply voltage VDD is changed, the present invention causes the voltage supplied to the pull-up line RTO of the BLSA 270 to be unchanged, thereby preventing an efficiency reduction in the over-driving. The term TRCD denotes a delay time from activation of data to prior to write or read operation thereof. There is an additional advantage that the TRCD of the memory device is improved.

It should be noted that the logic gates and transistors illustrated in the preferred embodiment as discussed above may be implemented in different type and arrangement based on polarities of input and output signals used therein.

As a result, the present invention adjusts timings (such as an operation sequence, a start time and a time duration) for providing an over-driving voltage to a pull-up line of a bit line sense amplifier and for discharging the voltage provided thereto based on a level change of a power supply voltage VDD when the voltage level of a power supply voltage VDD is changed in the state when a bit line over-driving operation is being progressed, thereby preventing efficiency reduction of the over-driving operation.

The present application contains subject matter related to Korean patent applications Nos. KR 10-2005-0091667 and KR 10-2006-0044164, filed with the Korean Intellectual Property Office on Sep. 29, 2005 and on May 17, 2006 respectively, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a voltage change sensor for detecting voltage levels of a power supply voltage and outputting a first signal and a second signal in response to the detected voltage levels when a voltage level of the power supply voltage is changed from a predetermined voltage level;
   a first voltage providing unit for supplying a higher voltage to a bit line sense amplifier in response to the second signal; and
   a second voltage providing unit, responsive to the first signal, for supplying a core voltage and the power supply voltage to the bit line sense amplifier, and discharging a voltage on a pull-up line of the bit line sense amplifier to thereby control a voltage level on the pull-up line of the bit line sense amplifier,
   wherein the higher voltage has a voltage level greater than that of the power supply voltage.

2. The semiconductor memory device as recited in claim 1, wherein the core voltage and the power supply voltage are input to the bit line sense amplifier through the pull-up line.

3. The semiconductor memory device as recited in claim 1, wherein the second voltage providing unit includes:
   a voltage adjustor configured to provide adjustment signals in response to the first signal;
   a core voltage supplier for supplying the core voltage to the pull-up line of the bit line sense amplifier under the control of the voltage adjustor;
   a high voltage supplier for supplying the higher voltage to the pull-up line of the bit line sense amplifier under the control of the high voltage controller;
   a power voltage supplier for providing the power supply voltage to the pull-up line of the bit line sense amplifier under the control of the voltage adjustor; and
   a discharging unit for discharging the voltage on the pull-up line of the bit line sense amplifier under the control of the voltage adjustor.

4. The semiconductor memory device as recited in claim 1, wherein the voltage change sensor includes:
   a current-mirror circuit, in which the power supply voltage whose voltage level is changed to be different from the predetermined voltage level by a change of PVT (Process, Voltage and Temperature) and a fixed voltage whose voltage level is unchanged are received, and a voltage level of an output voltage is changed depending on a level change of the power supply voltage;
   a first inverter for providing the output voltage of the current-mirror circuit to a predetermined output node;
   a second inverter for receiving the voltage signal from the predetermined output node and providing the voltage as the first signal; and
   a level shifter, if the voltage level of the power supply voltage is changed based on the voltage signal at the predetermined output node, for outputting the changed voltage as the second signal, and if the voltage level of the power supply voltage is unchanged, for outputting the power supply voltage as the second signal.

5. The semiconductor memory device as recited in claim 4, wherein the output voltage of the current-mirror circuit is such that a logic level supplied at the predetermined output node for a level change of the power supply voltage has a phase opposite to a logic level supplied at the predetermined output node for no level change of the power supply voltage.

6. The semiconductor memory device as recited in claim 4, wherein if the voltage level of the power supply voltage is changed to be lower than the predetermined voltage level by the PVT change, the level shifter outputs the changed voltage as the higher voltage.

7. The semiconductor memory device as recited in claim 4, wherein if the voltage level of the power supply voltage is changed to be higher than the predetermined voltage level by the PVT change, the level shifter outputs the changed voltage as the core voltage.

8. The semiconductor memory device as recited in claim 3, wherein the voltage adjustor includes:
   a level detector for detecting voltage levels of a first and a second charging voltages and a discharge voltage which are output in response to the first signal;
   a core voltage adjustor for outputting a core adjustment signal to control the core voltage supplier in response to the first signal and the first charging voltage, to thereby adjust time for supplying the core voltage to the pull-up line of the bit line sense amplifier;
   a power supply adjustor for outputting a power adjustment signal to control the power voltage supplier in response to the first signal and the second charging voltage, to thereby adjust time for supplying the power supply voltage to the pull-up line of the bit line sense amplifier; and
   a discharge voltage adjustor for outputting a discharge adjustment signal to control the discharging unit in response to the first signal and the discharge voltage, to thereby adjust time for discharging a voltage on the pull-up line of the bit line sense amplifier.

9. The semiconductor memory device as recited in claim 8, wherein the core voltage adjustor adjusts a logic level of the core adjustment signal provided in response to the first signal to thereby control on/off operations for supplying the core voltage to the pull-up line of the bit line sense amplifier.

10. The semiconductor memory device as recited in claim 8, wherein the core voltage adjustor adjusts time when the core adjustment signal is activated to logic high in response to a voltage level of the first charging voltage to thereby control a time duration of the core voltage supplied to the bit line sense amplifier.

11. The semiconductor memory device as recited in claim 8, wherein the power supply voltage adjustor adjusts a logic level of the power adjustment signal provided in response to the first signal to thereby control on/off operations for supplying the power supply voltage to the pull-up line of the bit line sense amplifier.

12. The semiconductor memory device as recited in claim 8, wherein the power supply voltage adjustor adjusts time when the power adjustment signal is activated to logic high in response to a voltage level of the second charging voltage to thereby control a time duration of the power supply voltage supplied to the bit line sense amplifier.

13. The semiconductor memory device as recited in claim 8, wherein the discharge voltage adjustor adjusts a logic level of the discharge adjustment signal provided in response to the first signal to thereby control on/off operations for discharging the voltage on the pull-up line of the bit line sense amplifier.

14. The semiconductor memory device as recited in claim 8, wherein the discharge voltage adjustor adjusts time when the discharge adjustment signal is activated to logic high in response to a voltage level of the discharge voltage to thereby control a discharge time of the voltage supplied to the bit line sense amplifier.

15. The semiconductor memory device as recited in claim 8, wherein the core voltage supplier includes an NMOS transistor for adjusting the core voltage received via a drain to be fed to the pull-up line of the bit line sense amplifier in response to the core adjustment signal input via a gate.

16. The semiconductor memory device as recited in claim 8, wherein the power voltage supplier includes an NMOS transistor for adjusting the power supply voltage received via a drain to be fed to the pull-up line of the bit line sense amplifier in response to the power adjustment signal input via a gate.

17. The semiconductor memory device as recited in claim 8, wherein the discharging unit includes an NMOS transistor for adjusting the voltage on the pull-up line of the bit line sense amplifier, received via a drain, to be discharged to a ground voltage, in response to the discharge adjustment signal input via a gate.

18. The semiconductor memory device as recited in claim 3, wherein the high voltage controller provides a higher voltage control signal in response to the second signal to thereby control an operation for supplying the higher voltage to the pull-up line of the bit line sense amplifier.

19. The semiconductor memory device as recited in claim 18, wherein the high voltage controller adjusts a logic level of the higher voltage control signal in response to a voltage level of the second signal to thereby control on/off operations for supplying the higher voltage to the pull-up line of the bit line sense amplifier.

20. The semiconductor memory device as recited in claim 18, wherein the high voltage supplier controls an operation for supplying the higher voltage received via a drain to the pull-up line of the bit line sense amplifier in response to the higher voltage control signal input via a gate.

21. The semiconductor memory device as recited in claim 1, wherein the first voltage providing unit includes;
   a higher voltage controller for generating a control signal in response to the second signal; and
   a higher voltage supplier for supplying the higher voltage to the pull-up line of the bit line sense amplifier under the control of the high voltage controller.

* * * * *